(12) United States Patent
Hoang et al.

(10) Patent No.: US 7,906,857 B1
(45) Date of Patent: Mar. 15, 2011

(54) MOLDED INTEGRATED CIRCUIT PACKAGE AND METHOD OF FORMING A MOLDED INTEGRATED CIRCUIT PACKAGE

(75) Inventors: Lan H. Hoang, San Jose, CA (US); Raghunandan Chaware, Sunnyvale, CA (US); Laurene Yip, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 140 days.

(21) Appl. No.: 12/047,676

(22) Filed: Mar. 13, 2008

(51) Int. Cl.
*H01L 23/48* (2006.01)

(52) U.S. Cl. ......... 257/783; 257/675; 257/706; 257/778; 257/782; 257/E33.075; 257/E23.051; 257/E21.511; 257/E21.514; 438/106; 438/108; 438/118; 438/119; 438/122

(58) Field of Classification Search .......... 257/675, 257/704, 710, 276, 625, 706, 707, 712–722, 257/796, E33.075, E31.131, E23.051, E23.08–E23.113, 257/678, 690, 692, 734, 778, 780–784, E21.511, 257/E21.514; 174/548; 361/696, 697, 701–703; 438/122, FOR. 413
See application file for complete search history.

(56) References Cited

U.S. PATENT DOCUMENTS

| | | | |
|---|---|---|---|
| 5,105,259 A | 4/1992 | McShane et al. | |
| 5,436,407 A | 7/1995 | Fehr et al. | |
| 5,455,456 A | 10/1995 | Newman | |
| 5,705,851 A * | 1/1998 | Mostafazadeh et al. | 257/675 |
| 5,889,323 A | 3/1999 | Tachibana | |
| 5,909,056 A * | 6/1999 | Mertol | 257/704 |
| 6,225,694 B1 | 5/2001 | Terui | |
| 6,225,695 B1 | 5/2001 | Chia et al. | |
| 6,288,900 B1 * | 9/2001 | Johnson et al. | 361/705 |
| 6,504,096 B2 | 1/2003 | Okubora | |
| 6,538,320 B1 | 3/2003 | Tosaya et al. | |
| 6,573,590 B1 | 6/2003 | Radu | |
| 6,597,575 B1 * | 7/2003 | Matayabas et al. | 361/705 |
| 6,713,863 B2 | 3/2004 | Murayama | |
| 6,770,113 B2 | 8/2004 | Vikram et al. | |
| 6,847,106 B1 * | 1/2005 | Howard et al. | 257/687 |
| 6,849,942 B2 | 2/2005 | Lin et al. | |
| 6,882,535 B2 | 4/2005 | Labanok et al. | |
| 6,919,630 B2 | 7/2005 | Hsiao | |
| 7,012,326 B1 | 3/2006 | Wu et al. | |
| 7,091,603 B2 * | 8/2006 | Mamitsu et al. | 257/706 |
| 7,361,995 B2 | 4/2008 | Goh et al. | |
| 7,402,906 B2 | 7/2008 | Rahman Khan et al. | |
| 2004/0121521 A1 * | 6/2004 | Jackson et al. | 438/108 |
| 2004/0174682 A1 | 9/2004 | Lin et al. | |
| 2004/0238947 A1 | 12/2004 | Rumer | |
| 2005/0077614 A1 | 4/2005 | Chengalva et al. | |
| 2008/0157300 A1 * | 7/2008 | Chuang et al. | 257/675 |

* cited by examiner

*Primary Examiner* — Jasmine J Clark
(74) *Attorney, Agent, or Firm* — John J. King; Thomas George

(57) ABSTRACT

A molded integrated circuit package is described. The molded integrated circuit package comprises a substrate having a plurality of contacts on a first surface; a die having a plurality of solder bumps on a first surface, the plurality of solder bumps being coupled to the plurality of contacts on the first surface of the substrate; an adhesive material positioned on a second surface of the die; a lid attached to the adhesive material; and an encapsulant positioned between the lid and the substrate. Methods of forming molded integrated circuit packages are also disclosed.

18 Claims, 6 Drawing Sheets

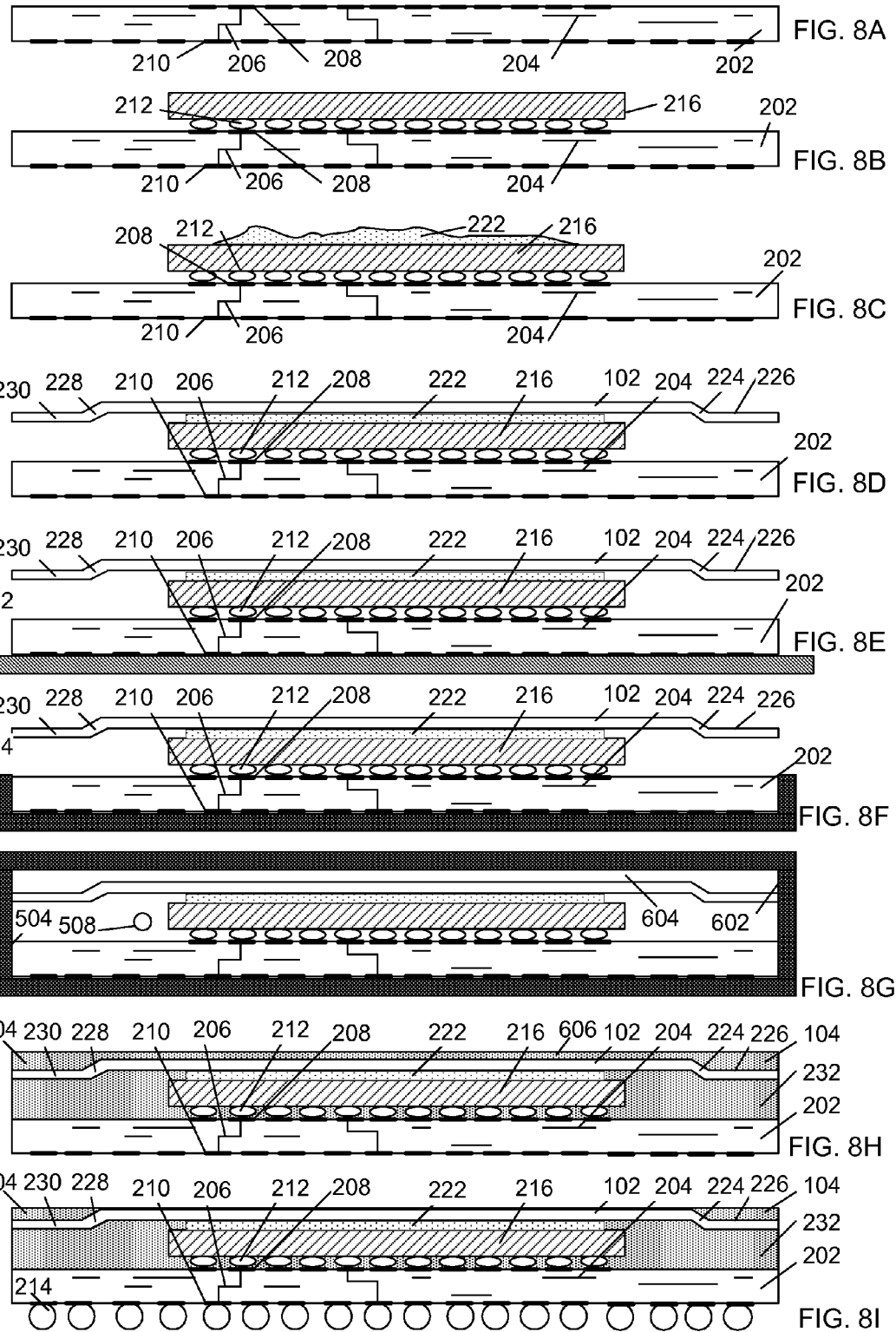

MOLDED INTEGRATED CIRCUIT PACKAGE AND METHOD OF FORMING A MOLDED INTEGRATED CIRCUIT PACKAGE

FIELD OF THE INVENTION

The present application relates generally to integrated circuits, and in particular, to a molded integrated circuit package and method of forming a molded integrated circuit package.

BACKGROUND OF THE INVENTION

Integrated circuit packages are formed using a variety of techniques. Heat sinks are often used in integrated circuit packages to dissipate heat from the device, preventing any failure of or damage to the device. Heat sinks are made of a variety of heat conducting materials and are formed in a variety of shapes to adequately conduct the heat from the device. One application of a heat sink is the use of a lid, where the lid is attached to the backside of the die of an integrated circuit to reduce the heat of the die and enable the integrated circuit to function properly. That is, the lid helps to dissipate heat to keep a semiconductor junction, such as a junction of the transistor, below a maximum specified operating temperature. Another purpose of the lid may be to provide some physical protection for the components within the lid. A lid for an integrated circuit, commonly made of a metallic or ceramic material, is attached on top of a flip chip package to provide protection to the silicon die and other discrete surface mount components.

However, these types of lid heat sinks often exhibit the problem of separating from the top of an integrated circuit package. Because the adhesion strength of any adhesive used to attach the conductive lid may not be strong enough to hold the conductive lid to the package, the conductive lid may come off of the package. Proper material construction and processing of the lid, the package, and the adhesive is required so that the lid will stay attached to the package during the assembly and long term field usage. Degradation of the adhesion may be caused by many factors, including improper dispensing of an adhesive which will not produce a complete adhesive surface as designed, shear stresses induced as a result of thermal expansion/shrinkage differences at the interfaces, push/pull stresses induced due to warping of the silicon, package, and/or board, adhesive degradation due to chemical attack, etc. Excessive component handling stresses, such as excessive torque or pressure during test, assembly, or rework, may also result in separation of the lid from the package.

In a conventional Flip Chip Ball Grid Array (FCBGA) package with a lid, the lid is attached to the backside of the die using an adhesive Thermal Interface Material (TIM) layer, also known as lid attach material. The lid is also coupled to the substrate using a lid seal adhesive where the lid itself encapsulates the die. The TIM layer is thermally conductive and it provides a good thermal path for heat to flow from the back of the die to lid. Usually the TIM layer is filled with thermally conductive fillers such as silver powder, gold powder or alumina. Heat dissipation from die backside of the die is affected by the type of TIM material, the total thickness of TIM layer, and the convection speed.

In case of a molded flip chip package, the lid is applied directly to the die, and the die is underfilled as well as overmolded with a mold compound, resulting in the use of a mold compound to encapsulate the die. An overmolded package offers high reliability, good resistance again harsh environment, and also improves electrical performance because thin core substrates may be used. While a molded flip chip package may employ a lid, one drawback of a conventional molded integrated circuit package is the inferior heat dissipation from backside of the die. Since mold compound between the die and the lid is composed of epoxy matrix and silica fillers, its heat conductivity is poor compared to a TIM layer. Moreover, due to differences in package and die tolerances, the mold cap or bondline thickness may vary and degrade the heat dissipation rate. The heat dissipation from the backside of the die, is significantly lower than the standard FCBGA structure.

Accordingly, there is a need for an improved molded integrated circuit package and method of forming a molded integrated circuit package.

SUMMARY OF THE INVENTION

A molded integrated circuit package is described. The molded integrated circuit package comprises a substrate having a plurality of contacts on a first surface; a die having a plurality of solder bumps on a first surface, the plurality of solder bumps being coupled to the plurality of contacts on the first surface of the substrate; an adhesive material positioned on a second surface of the die; a lid attached to the adhesive material; and an encapsulant positioned between the lid and the substrate. The molded integrated circuit package may comprise a lid having tapered edges, wherein the adhesive material is within the tapered edges of the lid. The encapsulant may extend above the tapered edges of the lid, wherein the lid comprises an exposed portion within the mold compound above the tapered edges.

A method of forming a molded integrated circuit package is also disclosed. The method comprises attaching a flip chip die to a substrate for an integrated circuit package; applying an adhesive material between a first surface of the flip chip die and a lid; providing an encapsulant between the lid and the substrate; and relieving pressure within the mold by way of the adhesive material. The method may further comprise preheating a compressible adhesive material before injecting the mold compound and at least partially curing the compressible adhesive material after inserting the substrate into the bottom mold.

According to an alternate embodiment, a method of forming a molded integrated circuit package comprises attaching a flip chip die to a substrate for an integrated circuit package; applying a compressible adhesive material between a first surface of the flip chip die and a lid; preheating the compressible adhesive material; positioning the substrate in a bottom mold; applying a top mold to the bottom mold; and providing an encapsulant between the lid and the substrate. The method may further comprise at least partially curing the compressible adhesive material after positioning the substrate in a bottom mold.

BRIEF DESCRIPTION OF THE DRAWINGS

FIG. 8 is a series of cross-sectional views showing the formation of the integrated circuit package of FIG. 3 according to an alternate embodiment of the process of FIG. 7;

DETAILED DESCRIPTION OF THE DRAWINGS

Figure 1:
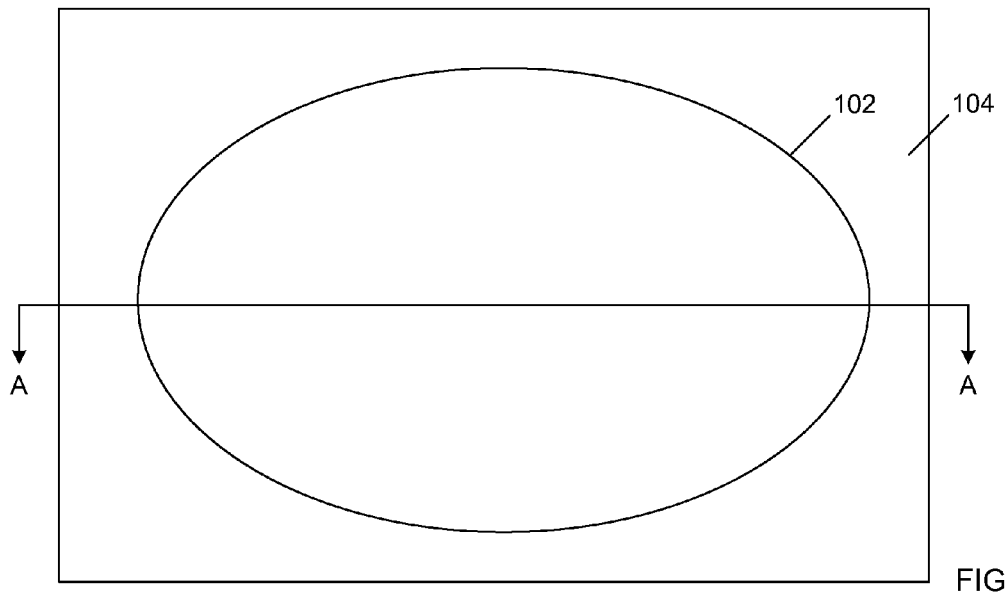
FIG. 1 is a top plan view of an integrated circuit package according to an embodiment the present invention.
Figure 2:
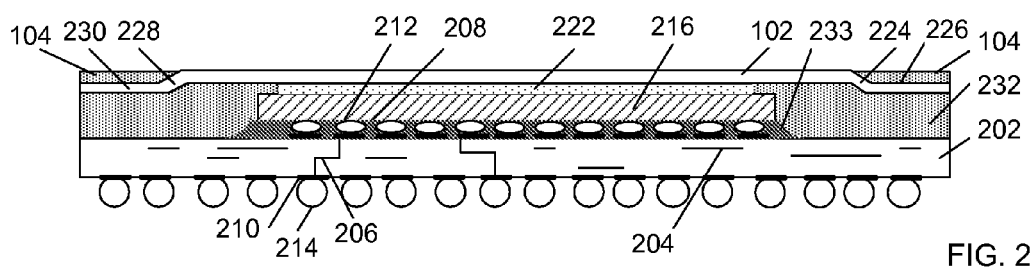
FIG. 2 is a cross-sectional view of an integrated circuit package of FIG. 1 taken at lines A-A according to an embodiment of the present invention.
Figure 3:
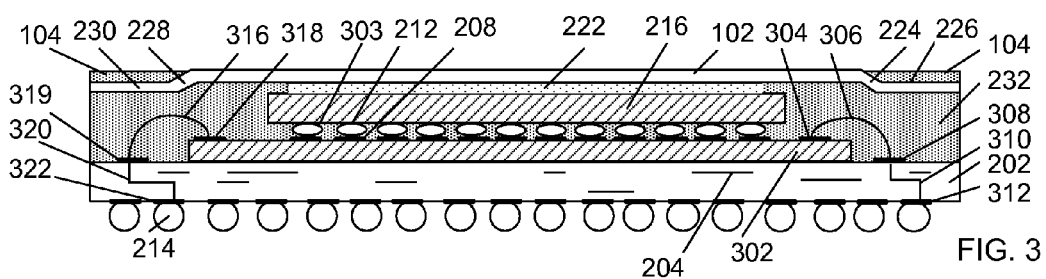
FIG. 3 is a cross-sectional view of an integrated circuit package of FIG. 1 taken at lines A-A according to an alternate embodiment of the present invention.
Figure 4:
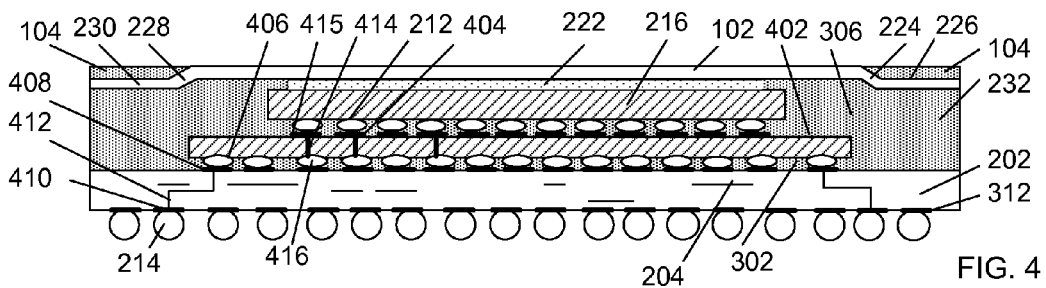
FIG. 4 is a cross-sectional view of an integrated circuit package of FIG. 1 taken at lines A-A according to another embodiment of the present invention.

Turning first to FIG. 1, a top plan view of an integrated circuit package according to an embodiment the present invention is shown. According to FIG. 1, a portion 102 of a lid is exposed, while portion 104 of a molded material extending over the lid is also visible. Cross-sectional views of the integrated circuit package of FIG. 1 taken at lines A-A are shown in FIGS. 2-4. Although a circular shape for the exposed portion of the lid is shown, other shapes may also be employed. The various embodiments of the present invention enable a thermally enhanced package structure which improves the heat dissipation performance of molded flip chip using a thermally conductive lid attach material, which may comprise a compressible TIM layer between the lid and die.

As shown in one embodiment detailed in the cross-sectional view of FIG. 2, the integrated circuit package comprises a substrate 202 having a plurality of interconnect lines 204. The interconnect lines formed by the interconnect layers are a part of a multilayer substrate enabling the coupling of electrical signals between contacts on the topside of the substrate, or between contacts on the topside and contacts on the bottom of the substrate. For example, an interconnect line 206, which may comprise vias and a portion of an interconnect layer of the substrate, enables the connection from a contact pad 208 on the top of the substrate to a contact pad 210 on the bottom of the substrate. A solder bump 212 is also coupled to the contact pad 208 enabling a connection internal to the package, while a solder ball 214 is coupled to the contact pad 210, enabling an external connection to the package. A die 216 comprises a plurality of solder bumps to enable a connection of the die to the substrate 202.

A TIM layer 222 is positioned between the portion 102 of the lid and the back side of the die which does not have solder bumps. The TIM layer provides a good thermal path for heat dissipation from the back of the die to the lid. If the adhesive material remains uncured, it will be flexible enough to absorb any stress during the molding process. As will be described in more detail below, the TIM layer may comprise a compressible adhesive. A significant advantage of compressible TIM layer is that it may compensate for dimensional tolerances of the mold without changing the thermal performance. As compared to a conventional molded integrated circuit package, the construction of the molded integrated circuit package using a TIM layer as shown provides a significant improvement in Theta Jc ($\theta jc$), which is a measure of heat dissipation from backside of the flip chip device. Accordingly, the construction will allow qualification and production of molded flip chip packages for commercial applications as well as harsh environment, such as military applications.

In addition to the portion 102 of the lid which is coupled to the compressible TIM layer, the lid comprises a first inclined portion 224 extending from the portion 102 to a flange portion 226, and a second inclined portion 228 extending to a second flange 230 to form a lid having tapered edges. As can be seen in FIG. 2, the portion 104 of the molded material 232 extends above the flange. Unlike a lid having a recess formed between the top and side walls of the lid which extend to the substrate and are attached to the substrate to encapsulate the die, the encapsulant 232 encapsulates the die and at least a portion of the lid by extending around the die and the lid. While first and second flange portions are described in the cross-sectional view of FIG. 2, the flange preferably extends around the entire perimeter of the lid below the portion 104 of the molded material shown in FIG. 1. Finally, an underfill material 233 may also be employed. The underfill may be dispensed using a dispensing machine at a temperature between approximately 80° C. and 110° C., and may comprise a liquid epoxy base material containing silica fillers. Because the filler loading in underfills is much lower than in mold compounds, the underfill will flow under the die by capillary action. The formation of the integrated circuit package will be described in more detail in reference to FIGS. 5-10 below.

As shown in FIGS. 3 and 4, cross-sectional views provide additional details of integrated circuit packages according to alternate embodiments of the present invention are shown. According to the embodiment of FIG. 3, a substrate 302 comprises a plurality of bond pads 303 coupled to receive the solder bumps of the die 216. An additional contact pad 304 on the surface of the substrate 302 provides a connection by way of a wire bond 306 to a contact pad 308 on the substrate 202. The contact pad 308 on the top of the substrate is coupled by a interconnect line 310 to a contact pad 312 on the bottom of the substrate. A wire bond 316 also provides a connection between a contact pad 318 to a control pad 319 on the surface of the substrate 202. A interconnect line 320 also provides an electrical connection to a contact 322 on the bottom of the substrate 202.

Rather than using wire bonding, the embodiment of FIG. 4 comprises a silicon substrate having "through silicon vias" (TSVs). In particular, a silicon substrate 402 comprises contact pads 404 coupled to receive the solder bumps 212. Some solder bumps are also coupled to solder balls on the bottom of the substrate 202. For example, a solder bump 406 is coupled to a contact pad 408, which makes an electrical connection to a contact pad 410 by way of an interconnect line 412. A TSV 414 is also shown extending through the silicon substrate 402 from a contact pad 415 to a solder bump 416. While the various arrangements of the die and substrate of the embodiments of FIGS. 2-4 are shown by way of example, the embodiments could include other variations, such as multichip modules. Further, although underfill materials are not shown, an underfill could be employed in either embodiment of FIG. 3 and FIG. 4.

Turning now to FIG. 5, a series of cross-sectional views show the formation of the integrated circuit package of FIG. 2 according to an embodiment of the present invention. In particular, after the substrate 202 is formed as shown in FIG. 5A, the die 216 is attached to substrate 202 by way of the solder bumps 212 and the contact pads 208, as shown in FIG. 5B. An underfill may also be applied after step 5B, as shown in FIG. 2, or in any of the embodiments of FIGS. 6-8 set froth below. After flip chip assembly and reflow, a sufficient TIM layer 222 is applied to the back of the die 216 as shown in FIG. 5C. The TIM layer may comprise a film, paste or epoxy form.

Figure 5A:
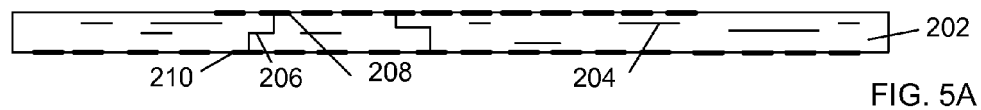
FIG. 5 is a series of cross-sectional views showing the formation of the integrated circuit package of FIG. 3 according to an embodiment of the present invention.
Figure 5B:
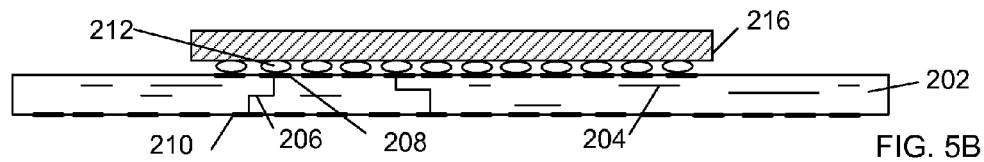
Figure 5C:
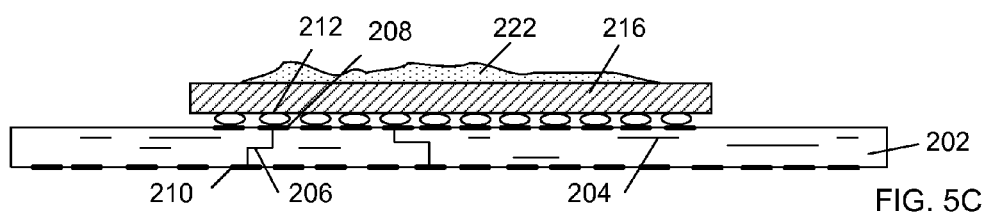
Figure 5D:
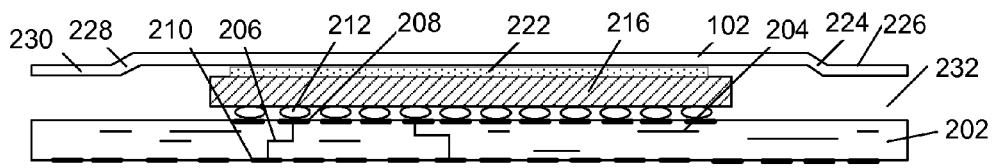
Figure 5E:
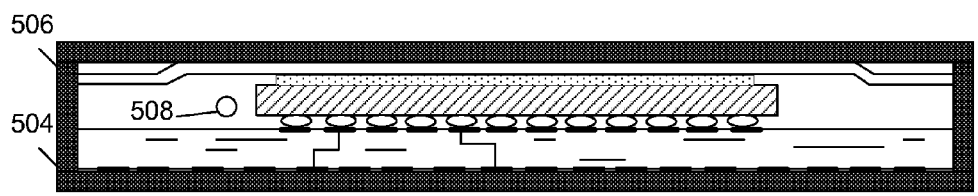
Figure 5F:
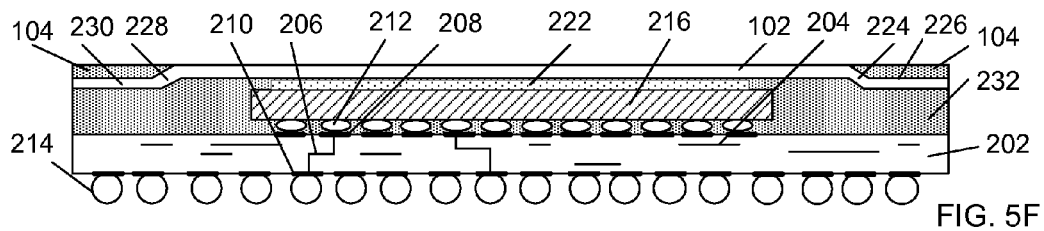

The volume of the material dispensed may be calculated based on the size of the die, tolerance of the mold cavity, and average bond line thickness. For example, for a die having dimensions of approximately 40 millimeters (mm) by 30 mm with a 0.4 mm bondline thickness, a volume of 36 mm³ may be dispensed. The lid is then attached to the TIM layer as shown in FIG. 5D, where the TIM layer has enough tack or adhesive strength to initially hold the lid in place. The top portion 506 of the mold is then attached to enclose the mold as shown in FIG. 5E. Alternatively, the TIM layer could be applied to the lid, where the lid having the TIM layer is attached to the die. While the TIM layer is shown leveled by the process of adding the lid, the TIM layer may be leveled by the attachment of the top portion of the mold. An encapsulant may be injected into the hole 508 of the top mold portion, for example. The encapsulant flows under the chip and around the cavity. If an underfill is used, the encapsulant flows around the underfill to fill the cavity. The encapsulant may comprise a mold compound, a liquid epoxy, or any other material used to form a molded integrated circuit. The mold is configured such that the encapsulant extends over the flange of the lid as shown in FIGS. 1-4. After a normal curing process for the encapsulant, the resulting integrated circuit package comprising a molded integrated circuit package is shown in FIG. 5F. While the process of forming the integrated circuit package is described in reference to the embodiments of FIG. 2, the process could be used for forming an integrated circuit according to the embodiments of FIGS. 3-4, or other molded integrated circuit packages.

Figure 6A:
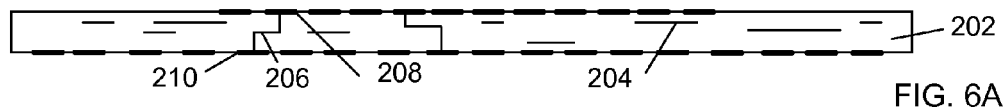
FIG. 6 is a series of cross-sectional views showing the formation of the integrated circuit package of FIG. 3 according to an alternate embodiment of the process of FIG. 5.
Figure 6B:
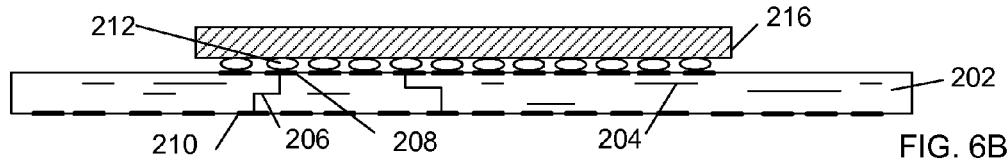
Figure 6C:
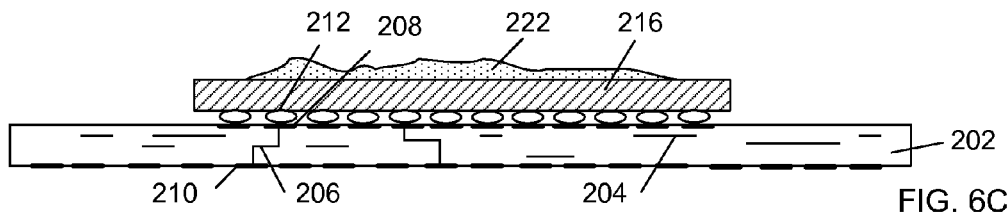
Figure 6D:
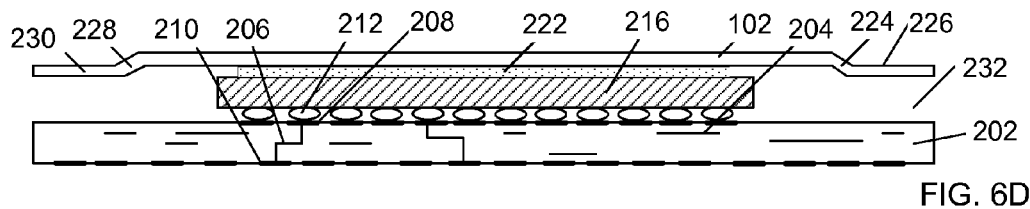
Figure 6E:
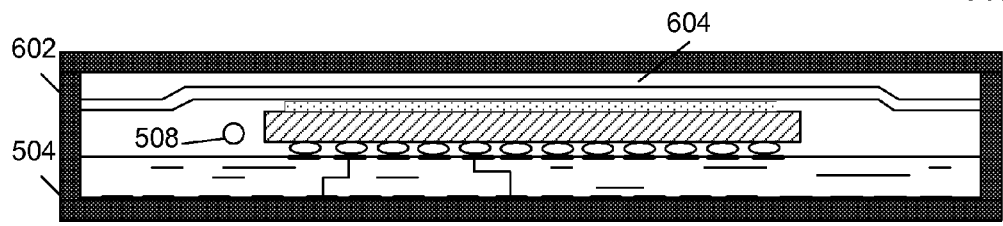
Figure 6F:
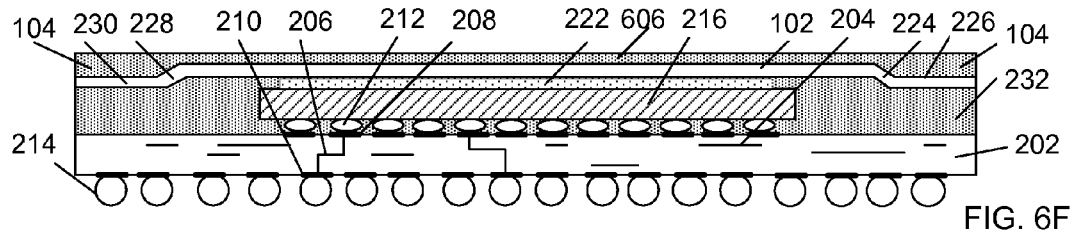
Figure 6G:
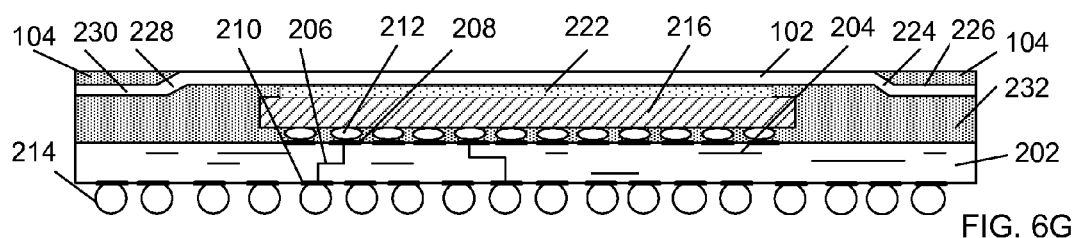
Figure 7A:
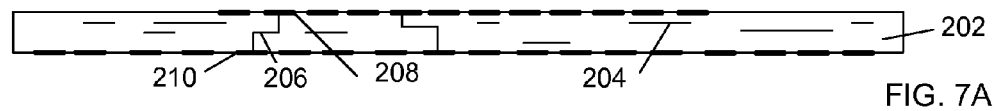
FIG. 7 is a series of cross-sectional views showing the formation of the integrated circuit package of FIG. 3 according to an embodiment of the present invention.
Figure 7B:
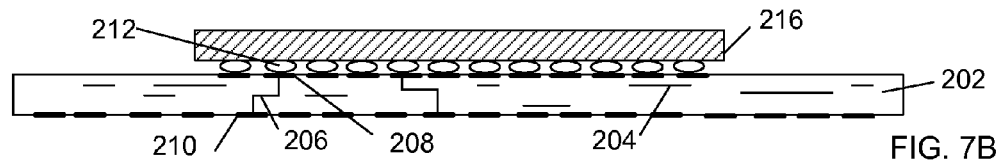
Figure 7C:
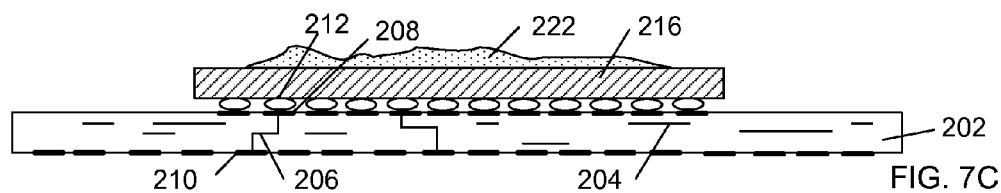
Figure 7D:
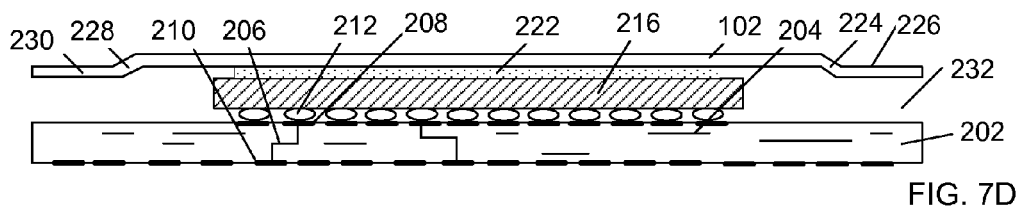
Figure 7E:
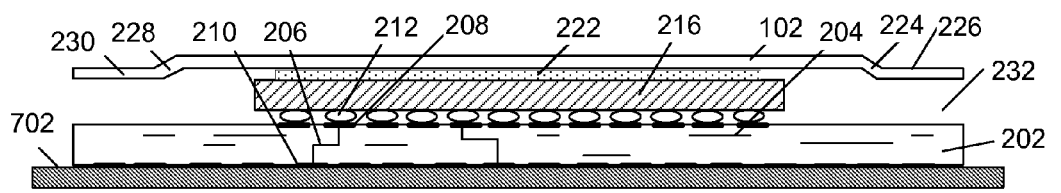
Figure 7F:
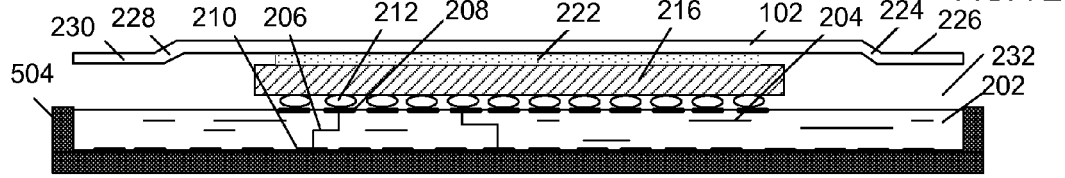
Figure 7G:
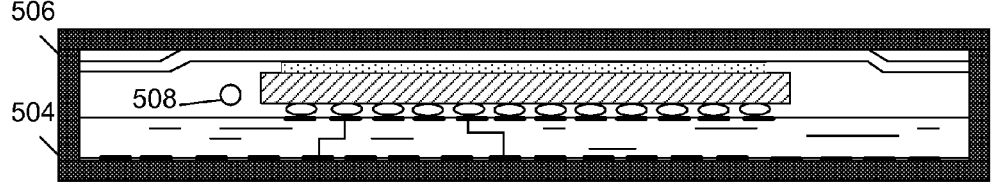
Figure 7H:
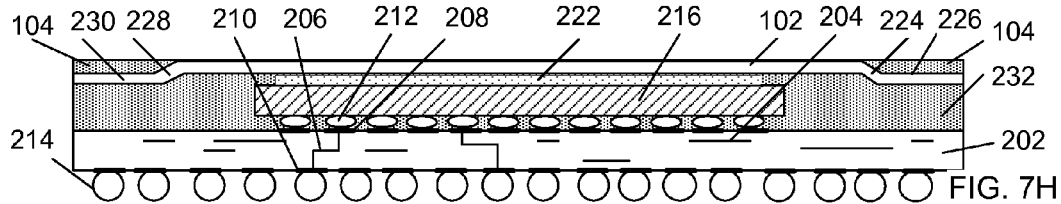

As shown in the embodiment of FIG. 6, an alternate embodiment comprises processing steps substantially the same as the embodiment as FIG. 5, except that a top portion 602 of the mold forming a gap 604 above the lid is used, as shown in FIG. 6E. Accordingly, the resulting integrated circuit package shown in FIG. 6F comprises a layer 606 of the encapsulant extending over the lid. The layer of the encapsulant is removed resulting in the final version of the integrated circuit package as shown in FIG. 6G, where the top portion of the lid may be exposed to the air as shown in FIG. 1 to improve the thermal conductivity of the lid.

Turning now to FIG. 7, a series of cross-sectional views show the formation of the integrated circuit package of FIG. 2 according to an alternate embodiment of the present invention using a compressible TIM material. After the substrate 202 is formed as shown in FIG. 7A, the die 216 is attached to substrate 202 by way of the solder bumps 212 and the contact pads 208, as shown in FIG. 7B. After flip chip assembly and reflow, a sufficient compressible TIM layer 222 is applied to the back of the die 216 as shown in FIG. 7C. The lid is then attached to the compressible TIM layer as shown in FIG. 7D, where the compressible TIM layer has enough tack or adhesive strength to initially hold the lid in place. Alternatively, the compressible TIM layer could be applied to the lid before the lid is attached to the die, as set forth above.

Additional processing steps are then performed to improve the quality of the integrated circuit package formed according to the embodiment of FIG. 7. As shown in FIG. 7E, a hot plate 702 enables preheating the compressible TIM layer 222. The substrate is heated using the hot plate for a period between approximately 15 seconds and 5 minutes, depending on the type of lid attach material used. During this step the lid attach material undergoes partial curing. Accordingly, the material will be soft enough to absorb stress during molding, but hard enough to maintain good adhesion between lid and die. The substrate 202 is then placed in the bottom portion 504 of a mold which forms the molded integrated circuit package, as shown in FIG. 7F. The part is then heated for approximately 5 seconds at the mold temperature to achieve thermal equilibrium. The stage time in the mold is preferably short to avoid excessive curing of the compressible TIM layer. The top portion 506 of the mold is then attached to enclose the mold as shown in FIG. 7G. The encapsulant such as a mold compound or liquid epoxy may be injected into the hole 508 of the top mold portion. The encapsulant flows under the chip and around the cavity, where the mold is configured such that the encapsulant extends over the flange of the lid. After a normal curing process for the encapsulant, the resulting integrated circuit package comprising a molded integrated circuit package is shown in FIG. 7H. According to the embodiment of FIG. 8, the top portion 602 of the mold is used in the embodiment of FIG. 7, where the top portion 602 forms a gap 604 resulting in the additional layer 606, which is removed to form the final integrated circuit package as shown in FIG. 8I. While the processes shown in FIGS. 5-8 show injection molding, any other technique such as compression molding, transfer molding, or dispensing of mold materials, may be employed.

Material properties of the thermal interface material are adjusted in such as way that during the molding process, the majority of the stress exerted on the lid is absorbed by the TIM layer and not transferred to the die or flip chip solder bumps. The stress may be exerted for example when the top mold is positioned over the lid and/or when the encapsulant is inserted into the mold. The TIM layer is selected such that it is compatible with the mold compound and may co-cure with the mold compound to provide a good adhesion between the mold compound and the TIM layer. Some of the materials that may be used for the TIM layer include silicon materials, a thermal grease or gel, a latent cure toughened epoxy, a phase change material, and soft solders with very low melting points. Typical property ranges for the compressible TIM material include a Young's modulus at 25° Celsius (C) of approximately 0.35 millipascals (mPa) to 15 MPa, a glass transition temperature (Tg) between approximately −35° to −5° C. such that the material at room and operating temperature material is very soft, and a Coefficient of Thermal Expansion (CTE) between approximately 110 to 200 (ppm/° C.). In contrast, a mold compound may have a Young's modulus of approximately 1500 kg/mm² to 2900 kg/mm² at 25° C. and approximately 30 kg/mm² to 200 kg/mm² at 260° C. A mold compound may also have a Tg of approximately 110° C. to 165° C. and a CTE of approximately 8 to 16 ppm/° C. The silica filler content of the mold compound may be approximately 80-90% by weight.

The thermally enhanced molded integrated circuit package construction of FIGS. 5-8 provides a significant improvement achieved over a standard molded flip chip package. Thermal performance of the thermally enhanced molded flip chip is very similar to and may exceed a standard FCBGA package. Some advantages of the thermally enhanced molded integrated circuit package construction of FIGS. 5-7 include very good thermal dissipation from die backside; high reliability; and resistance from harsh environments, such as in aerospace, defense, automotive markets. Also, thin core substrates and coreless substrates may be used for flip chip packaging, which may offer significant improvement in electrical performance.

Figure 9:
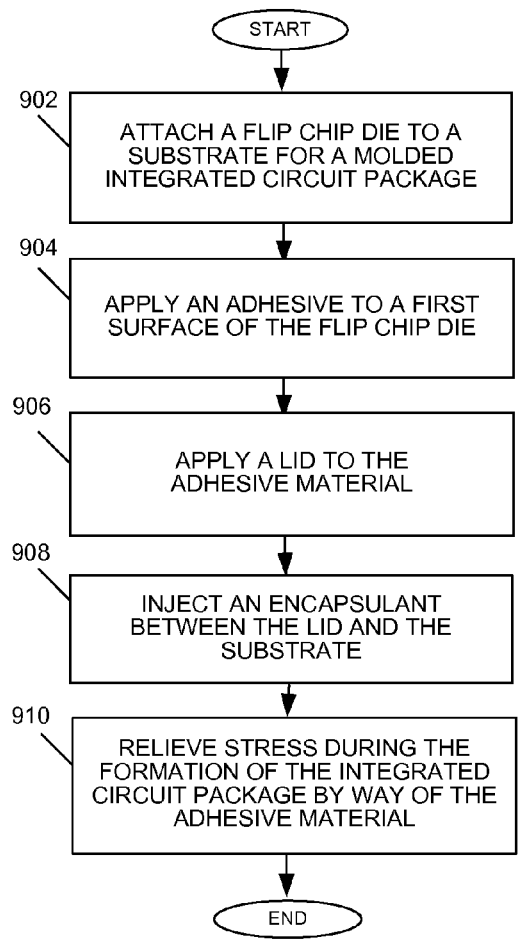
FIG. 9 is a flow chart showing a method of forming an integrated circuit package according to an embodiment of the present invention.

Turning now to FIG. 9, a flow chart shows a method of forming an integrated circuit package according to an embodiment of the present invention. A flip chip die is attached to a substrate for a molded integrated circuit package at a step 902. A thermal adhesive layer is applied to a first surface of the flip chip die at a step 904. The thermal adhesive layer may be a compressible thermal adhesive layer as described above. A lid is applied to the thermal adhesive layer at a step 906. An encapsulant is provided between the lid and the substrate at a step 908. Stress during the formation of the integrated circuit package is relieved by way of the adhesive material at a step 910.

Figure 10:
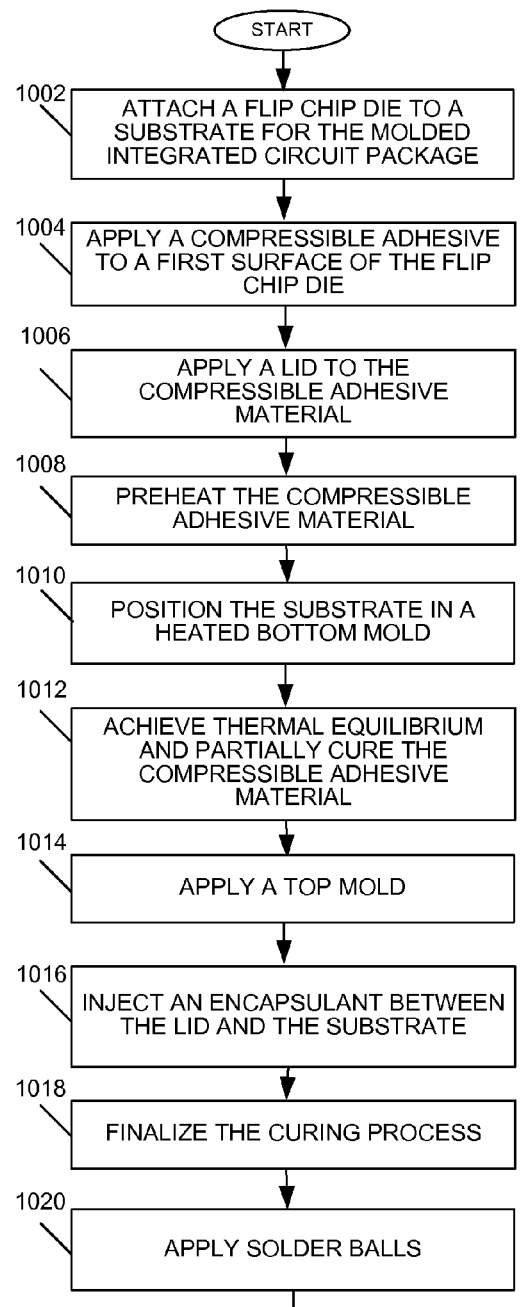
FIG. 10 is a flow chart showing a method of forming an integrated circuit package according to an alternate embodiment the present invention.

Finally, a flow chart of FIG. 10 shows a method of forming an integrated circuit package according to an alternate embodiment the present invention. A flip chip die is attached to a substrate for a molded integrated circuit package at a step 1002. A compressible adhesive is attached to a first surface of the flip chip die at a step 1004. A lid is applied to the compressible adhesive material at a step 1006. Alternatively, the compressible adhesive material is applied to the lid, which is then applied to the die. The compressible adhesive material is preheated to at least partially cure the material at a step 1008. The substrate is positioned in a bottom mold which is heated to achieve thermal equilibrium at a step 1010, and the compressible adhesive material is at least partially cured at a step 1012 before a top mold is applied at a step 1014. An encapsulate is provided between the lid and the substrate at a step 1016. The curing process is finalized at a step 1018. Finally, solder balls are applied to the integrated circuit package at a step 1020. The method of FIGS. 9 and 10 may be implemented according to the embodiments of FIGS. 1-8 as shown and described, or using any other suitable integrated circuit packages.

It can therefore be appreciated that the new and novel molded integrated circuit package and method of forming a molded integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A molded integrated circuit package comprising:
a substrate having a plurality of contacts on a first surface and extending from a first end to a second end;
a die having a plurality of solder bumps on a first surface, the plurality of solder bumps being coupled to the plurality of contacts on the first surface of the substrate;
an adhesive material positioned on a second surface of the die;
a lid comprising a first surface attached to the adhesive material and a flange extending around the perimeter of the lid, wherein the lid extends substantially from the first end of the substrate to the second end of the substrate; and
an encapsulant positioned between the lid and the substrate and above the flange of the lid,
wherein the adhesive material comprises a compressible adhesive material to absorb stress exerted on the lid.

2. The molded integrated circuit package of claim 1 wherein the lid comprises tapered edges.

3. The molded integrated circuit package of claim 2 wherein the compressible adhesive material is within the tapered edges of the lid.

4. The molded integrated circuit package of claim 2 wherein the encapsulant extends above the tapered edges of the lid.

5. The molded integrated circuit package of claim 4 wherein the lid comprises an exposed portion within the encapsulant extending above the tapered edges.

6. The molded integrated circuit package of claim 1 wherein the substrate comprises a ball grid array having a plurality of solder balls on a second surface of the substrate.

7. The molded integrated circuit package of claim 1 further comprising at least one of a wire bond and a through silicon via.

8. A method of forming a molded integrated circuit package, the method comprising:
attaching a plurality of solder bumps of a flip chip die to a plurality of contacts on a first surface of a substrate of the molded integrated circuit package, wherein the substrate extends from a first end to a second end;
applying a compressible adhesive material between a first surface of the flip chip die and a lid to absorb stress exerted on the lid, wherein the lid comprises a first surface attached to the compressible adhesive material and a flange extending around the perimeter of the lid, and the lid extends substantially from the first end to the second end of the substrate;
providing an encapsulant between the lid and the substrate and above the flange of the lid within a mold; and
relieving pressure within the mold by way of the adhesive material.

9. The method of claim 8 further comprising preheating the compressible adhesive material before providing the encapsulant.

10. The method of claim 8 further comprising at least partially curing the compressible adhesive material after inserting the substrate into a bottom mold.

11. The method of claim 10 further comprising attaching a top mold to the bottom mold, wherein providing the encapsulant comprises injecting a mold compound over tapered edges of the lid.

12. The method of claim 11 further comprising performing a final curing process.

13. The method of claim 8 further removing a portion of the encapsulant to expose a portion of the lid.

14. A method of forming a molded integrated circuit package, the method comprising:
attaching a plurality of solder bumps of a flip chip die to a plurality of contacts on a first surface of a substrate of the molded integrated circuit package, wherein the substrate extends from a first end to a second end;
applying a compressible adhesive material between a first surface of the flip chip die and a lid to absorb stress exerted on the lid, wherein the lid comprises a first surface attached to the compressible adhesive material and a flange extending around the perimeter of the lid, and the lid extends substantially from the first end to the second end of the substrate;
preheating the compressible adhesive material;
positioning the substrate in a bottom mold;
applying a top mold to the bottom mold; and
providing an encapsulant between the lid and the substrate and above the flange of the lid.

15. The method of claim 14 further comprising at least partially curing the compressible adhesive material after positioning the substrate in the bottom mold.

16. The method of claim 15 wherein at least partially curing the compressible adhesive material comprises heating the bottom mold.

17. The method of claim 14 wherein providing an encapsulant between the lid and the substrate comprises providing a mold compound between the lid and the substrate and above the flange of the lid.

18. The method of claim 14 wherein providing an encapsulant between the lid and the substrate comprises providing a liquid epoxy between the lid and the substrate and above the flange of the lid.

* * * * *